(12) United States Patent
Basavalingappa et al.

(10) Patent No.: US 12,302,648 B2
(45) Date of Patent: May 13, 2025

(54) BACKSIDE ILLUMINATED SINGLE PHOTON AVALANCHE DIODE

(71) Applicant: Sony Semiconductor Solutions Corporation, Kanagawa (JP)

(72) Inventors: Adarsh Basavalingappa, Penfield, NY (US); Cristian Tivarus, Pittsford, NY (US); Sungin Hwang, Pittsford, NY (US); Yoshiaki Tashiro, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 756 days.

(21) Appl. No.: 17/390,366

(22) Filed: Jul. 30, 2021

(65) Prior Publication Data
US 2023/0030282 A1    Feb. 2, 2023

(51) Int. Cl.
| | | |
|---|---|---|
| *H01L 27/146* | (2006.01) | |
| *H10F 30/225* | (2025.01) | |
| *H10F 39/00* | (2025.01) | |
| *H10F 39/12* | (2025.01) | |

(52) U.S. Cl.
CPC ....... *H10F 30/2255* (2025.01); *H10F 39/199* (2025.01); *H10F 39/803* (2025.01); *H10F 39/8063* (2025.01); *H10F 39/8067* (2025.01); *H10F 39/807* (2025.01); *H10F 39/811* (2025.01)

(58) Field of Classification Search
CPC .......... H01L 31/1075; H01L 27/14609; H01L 27/14627; H01L 27/14629; H01L 27/1463; H01L 27/14636; H01L 27/1464; H01L 27/14603; H01L 27/14634; H01L 27/1461; G01S 7/4863
See application file for complete search history.

(56) References Cited

U.S. PATENT DOCUMENTS

| | | | |
|---|---|---|---|
| 8,008,741 B2* | 8/2011 | Yamamura | H01L 27/14636 257/E31.116 |
| 8,994,135 B2* | 3/2015 | Yamamura | H01L 27/1464 257/443 |
| 2015/0200222 A1* | 7/2015 | Webster | H01L 31/02027 250/208.1 |
| 2015/0285625 A1* | 10/2015 | Deane | G01S 7/4817 348/140 |
| 2020/0343389 A1 | 10/2020 | Gäbler | |

FOREIGN PATENT DOCUMENTS

WO    WO-2020170841 A1    8/2020

* cited by examiner

*Primary Examiner* — Tony Ko
(74) *Attorney, Agent, or Firm* — Micheal Best & Friedrich LLP

(57) ABSTRACT

A sensor chip including a resistor and a backside illuminated single photon avalanche diode (SPAD) that is connected to the resistor; and a sensor including a sensor chip with a resistor and a backside illuminated SPAD that is connected to the resistor. The backside illuminated SPAD including an anode, a cathode, and a multiplication structure.

20 Claims, 16 Drawing Sheets

BACKSIDE ILLUMINATED SINGLE PHOTON AVALANCHE DIODE

BACKGROUND OF THE INVENTION

1. Field of the Invention

This application relates generally to image sensors. More specifically, this application relates to a backside illuminated single-photon avalanche diode (SPAD).

2. Description of Related Art

Direct Time-of-Flight (d-ToF) may be used to support augmented reality (AR), virtual reality (VR) technologies, automotive applications, such as LIDARs, and other imaging technologies. A single-photon avalanche diode (SPAD) may be used to perform photon counting with a Geiger mode operation. Photon counting is an important aspect for accurately performing d-ToF.

A SPAD digitizes the time-of-arrival of individual photons with a time-to-digital converter (TDC). The single-photon events are detectable because each photon creates an electron avalanche, which amplifies the signal. SPADs are operated well above their breakdown voltage to enable avalanching. The extreme voltages necessary for single photon detection cause reliability failures of transistors in the TDC and circuitry before the TDC.

Additionally, conventional SPADs are limited due to poor sensitivity in near infrared (NIR) spectrum, high dark count rate (DCR), poor reliability performance, low resolution, low fill factor, low photon detection efficiency (PDE), and high parasitic electrical or electro-luminescence related crosstalk (X-talk) between neighboring pixels.

BRIEF SUMMARY OF THE INVENTION

An electronic imaging device of the present disclosure is a sensor chip including a resistor and a SPAD that addresses some or all of the limitations in the conventional SPADs. For example, the resistor, a clamp diode, and PMOS transistor are added to separate the highly negative SPAD voltage from vulnerable transistors in a logic chip. The resistor may be made of one or more poly-resistor segments that are located on the sensor chip separate from the logic chip. In some examples, different segments of the poly-resistor may be connected to each other through low resistance connections to avoid sharp curvatures in the poly-resistor.

In one aspect of the present disclosure, there is provided a sensor chip. The sensor chip includes a resistor and a backside illuminated single photon avalanche diode (SPAD). The backside illuminated SPAD includes an anode, a cathode, and a multiplication structure.

In another aspect of the present disclosure, there is a sensor. The sensor includes a sensor chip with a resistor and a backside illuminated SPAD that is connected to the resistor. The backside illuminated SPAD including an anode, a cathode, and a multiplication structure.

In this manner, the above aspects of the present disclosure provide for improvements in at least the technical field of imaging, as well as the related technical fields of image sensor architecture, image processing, and the like.

This disclosure can be embodied in various forms, including image sensor circuits and the like. The foregoing summary is intended solely to give a general idea of various aspects of the present disclosure and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth. It will be readily apparent to one skilled in the art that these specific details are merely examples and not intended to limit the scope of this application.

Moreover, while the present disclosure focuses mainly on examples in which SPADs are used in image sensors, it will be understood that this is merely one example of an implementation. It will further be understood that the disclosed devices may be used in any device in which there is a need to perform photon detection, for example, in a smartphone or tablet, and the like. Furthermore, the sensor implementations described below may be incorporated into an electronic apparatus, including but not limited to, a smartphone, a tablet computer, a laptop computer, or other electronic apparatus.

Imaging Device

Figure 1:
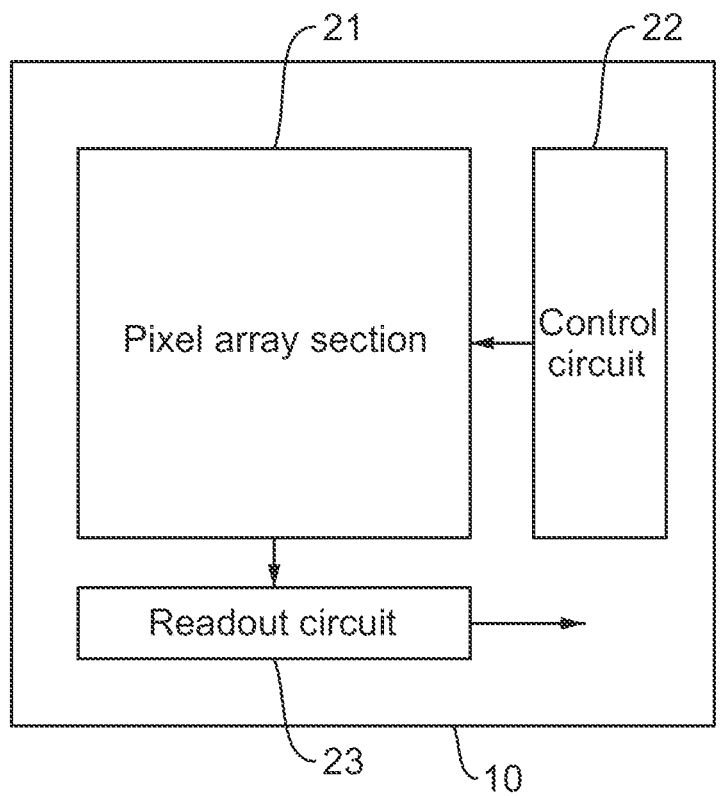
FIG. 1 is a diagram illustrating a sensor, in accordance with various aspects of the present disclosure.

FIG. 1 is a diagram illustrating a sensor 10, in accordance with various aspects of the present disclosure. The sensor 10 is a sensor that receives incoming light, converts an amount of the incoming light imaged on an imaging surface into an electric signal for each pixel unit, and outputs a pixel signal indicating an amount of the incoming light.

In FIG. 1, the sensor 10 includes a pixel array section 21, a control circuit 22, and a readout circuit 23. In the pixel array section 21, a plurality of SPAD (Single Photon Avalanche Diode) pixels is two-dimensionally arranged (for example, arranged in a matrix). Each SPAD pixel is a pixel including a single photon avalanche photodiode (SPAD). This single photon avalanche photodiode has a structure of an avalanche section (referred to herein as a "multiplication structure" or "multiplication region") in a semiconductor so as to detect one photon, through which an electron is photo-electrically converted from one photon, and the electron is multiplied (amplified) tens of thousands times.

An impedance of each SPAD decreases based on an amount of light irradiation. Large amounts of light irradiation significantly decreases the impedance of each SPAD and failures may occur when a voltage at a cathode of a SPAD swings more negatively than expected. For example, photoelectric conversion impedance may decrease about one hundred ohms at large amounts of light (e.g., 500 kW/cm$^2$). An unexpected negative voltage may be up to a negative ten to twenty volts (V), although other negative voltages are possible.

The control circuit 22 controls an operation of each section of the sensor 10. In addition, the control circuit 22 outputs a control signal (pulse) for driving the SPAD pixels via a pixel driving line, to thereby controlling the driving of the plurality of SPAD pixels two-dimensionally arranged on the pixel array section 21. For example, the control circuit 22 controls the driving of the plurality of SPAD pixels two-dimensionally arranged on the pixel array section 21 on the basis of a detection result of illuminance.

The readout circuit 23 successively scans the plurality of SPAD pixels two-dimensionally arranged on the pixel array section 21 and reads out the pixel signal generated by each SPAD pixel via a signal line. The readout circuit 23 outputs the read out pixel signal to a signal processing circuitry.

Figure 2:
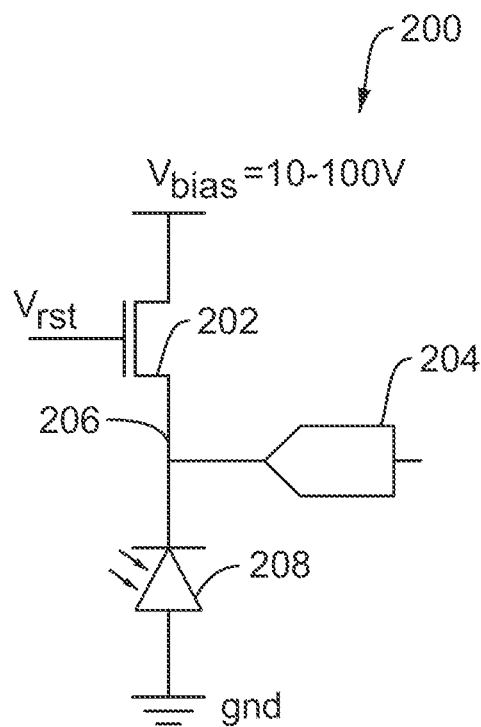
FIG. 2 is a circuit diagram illustrating a backside illuminated (BSI) single-photon avalanche diode (SPAD)

FIG. 2 is a circuit diagram illustrating a BSI SPAD 200. The BSI SPAD 200 includes a reset transistor 202, a time-to-digital converter (TDC) 204, an output node 206, and a SPAD 208. The SPAD 208 digitizes the time-of-arrival of individual photons with the TDC 204.

However, the extreme voltages necessary for single photon detection cause reliability failures of transistors in the TDC 204 or circuitry (not shown) between the SPAD 208 and the TDC 204. According to the present disclosure, the reliability failures in the TDC 204 or circuitry (not shown) between the SPAD 208 and the TDC 204 is reduced or eliminated.

Figure 3:
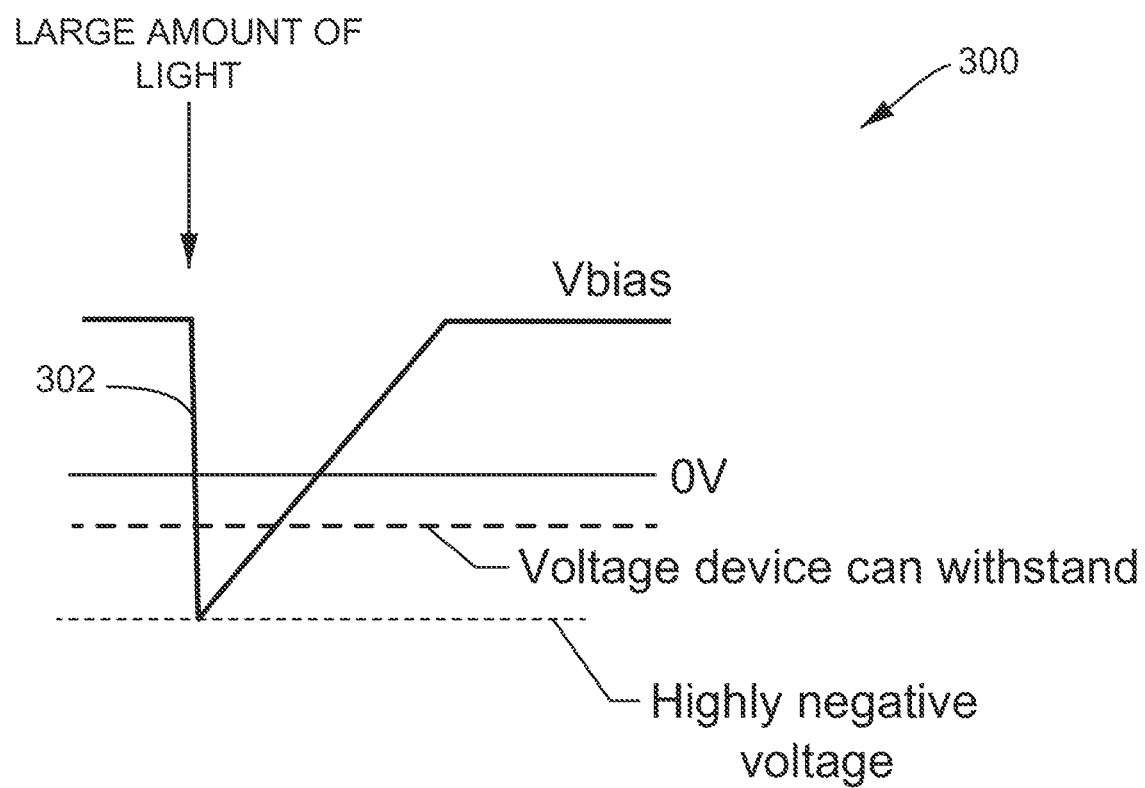
FIG. 3 is a diagram illustrating a bias voltage of the BSI SPAD of FIG. 2.

FIG. 3 is a diagram illustrating a bias voltage 302 of the BSI SPAD 200 of FIG. 2. As illustrated in FIG. 3, when the BSI SPAD 200 is subjected to a large amount of light, then the bias voltage 302 is a highly negative voltage that goes below zero volts and below a voltage that a TDC can withstand. The bias voltage 302 being a highly negative voltage causes the failures in the TDC or other circuitry.

Figure 4:
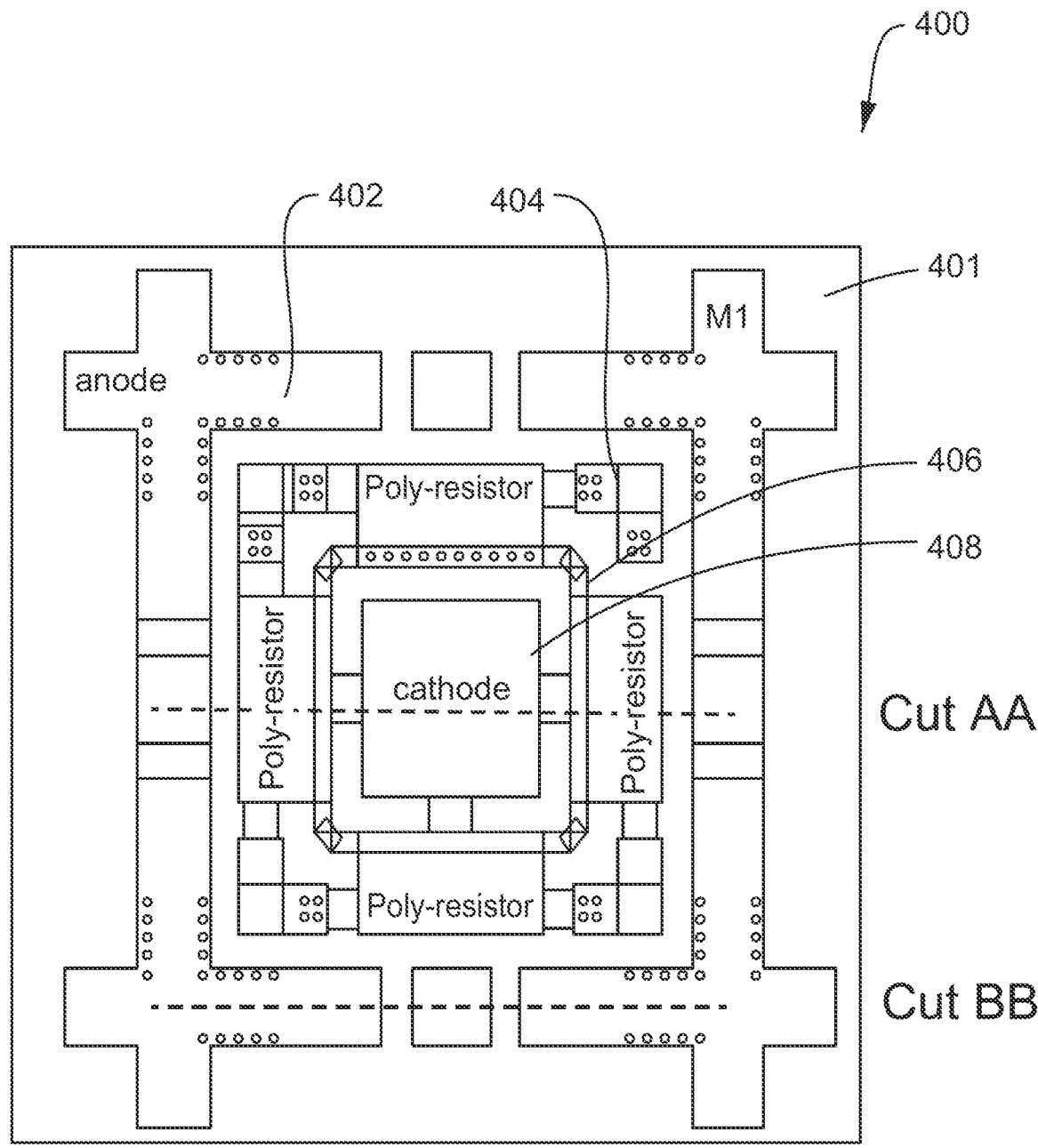
FIG. 4 is diagram illustrating a plan view of a BSI SPAD, in accordance with various aspects of the present disclosure.

FIG. 4 is diagram illustrating a plan view 400 of a BSI SPAD 401, in accordance with various aspects of the present disclosure. The BSI SPAD 401 includes an anode 402, a poly-resistor 404, a barrier 406, and a cathode 408. The barrier 406 is not a physical barrier. Instead, the barrier 406 is an electric potential barrier that arises from dopant profiles and applied bias conditions. An electric potential barrier prevents electrons from moving one part of silicon to the other.

Figure 5:
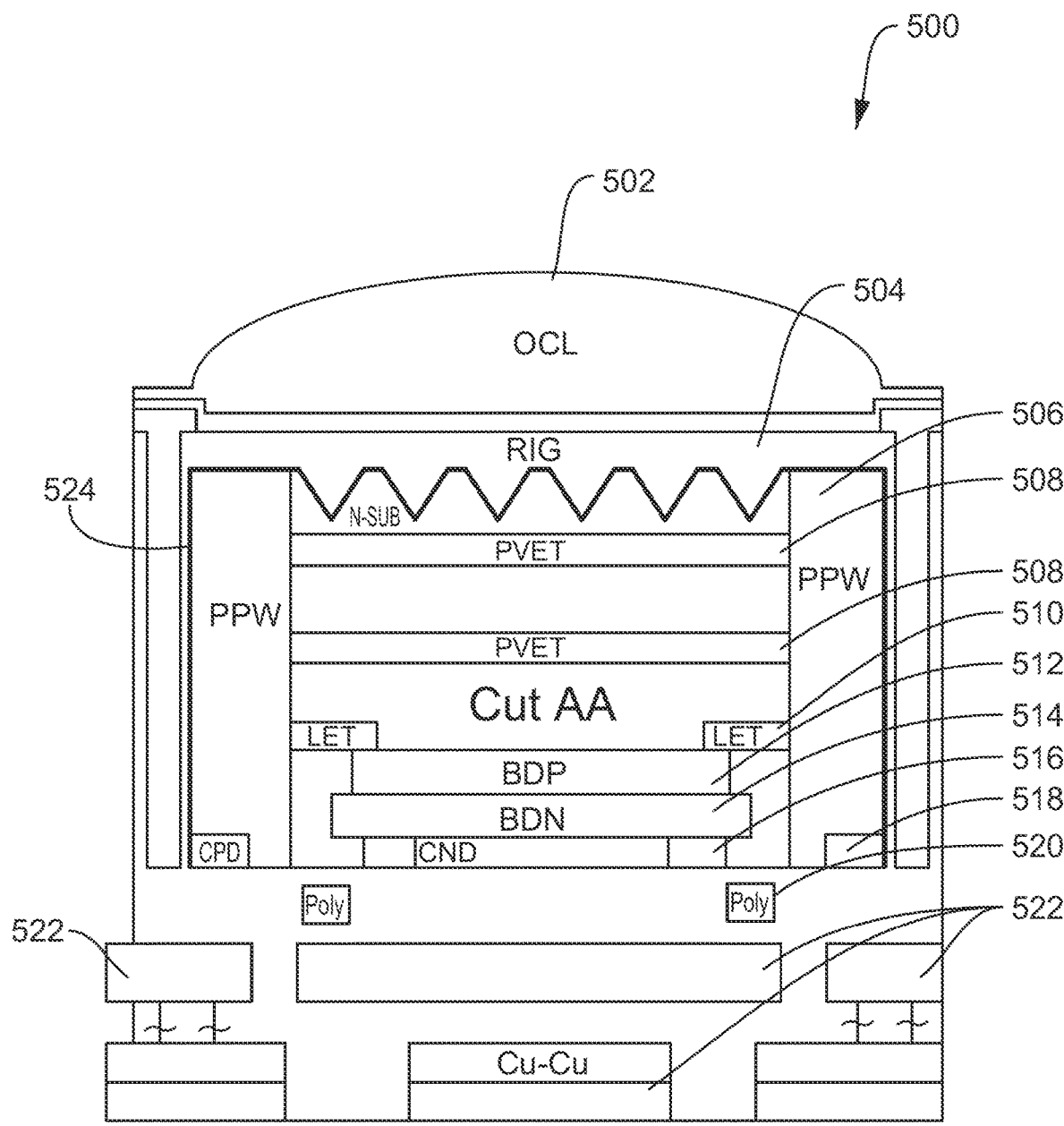
FIG. 5 is diagram illustrating a first cross-section view of the BSI SPAD of FIG. 4, in accordance with various aspects of the present disclosure.

FIG. 5 is diagram illustrating a first cross-section view 500 of the BSI SPAD 401 of FIG. 4, in accordance with various aspects of the present disclosure. The BSI SPAD 401 of FIG. 4, in the first cross-section view 500, includes an On-Chip Lens (OCL) 502, a pyramid surface for diffraction (RIG) 504, a passivation p-type well (PPW) 506, a P-type vertical electrical transport (PVET) 508, a lateral electrical transport (LET) 510, a breakdown p-type implant (BDP) 512, a breakdown n-type implant (BDN) 514, a contact n-type diode implant (CND) 516, a contact p-type diode implant (CPD) 518, a poly-resistor 520, copper wirings 522, and an undoped silicon 524. The PPW 506, PVET 508, LET 510, BDP 512, BDN 514, CND 516, CPD 518 are implantations using corresponding masks. The implanted dopants are then annealed to activate and diffuse. The OCL 502, the RIG 504, the poly-resistor 520, and the copper wirings are physical layers.

As illustrated in FIG. 5, the poly-resistor 520 and the copper wirings 522 are embedded in the RIG 504. The OCL 502 is disposed on the RIG 504. The BDN 514 is implanted on the CND 516 and the BDP 512 is implanted on the BDN 514. The LET 510 is implanted on the BDP 512 and extends between the BDP 512 and the PPW 506.

The BSI SPAD 401 coverts a photon from the OCL 502 to an electron. The LET 510, the BDP 512, and the BDN 514 is a multiplication structure that multiplies an electron count. The OCL 502 is one or more micro-lenses focusing light on the multiplication structure.

Additionally, as illustrated in FIG. 5, the undoped silicon 524 from the original silicon wafer is between the RIG 504 and the CPD 518. The undoped silicon 524 is from the original silicon wafer that existed prior to processing and was left behind when the original silicon wafer was processed and thinned down. The undoped silicon 524 has a vertical thickness of at least five micrometers (μm).

Figure 6:
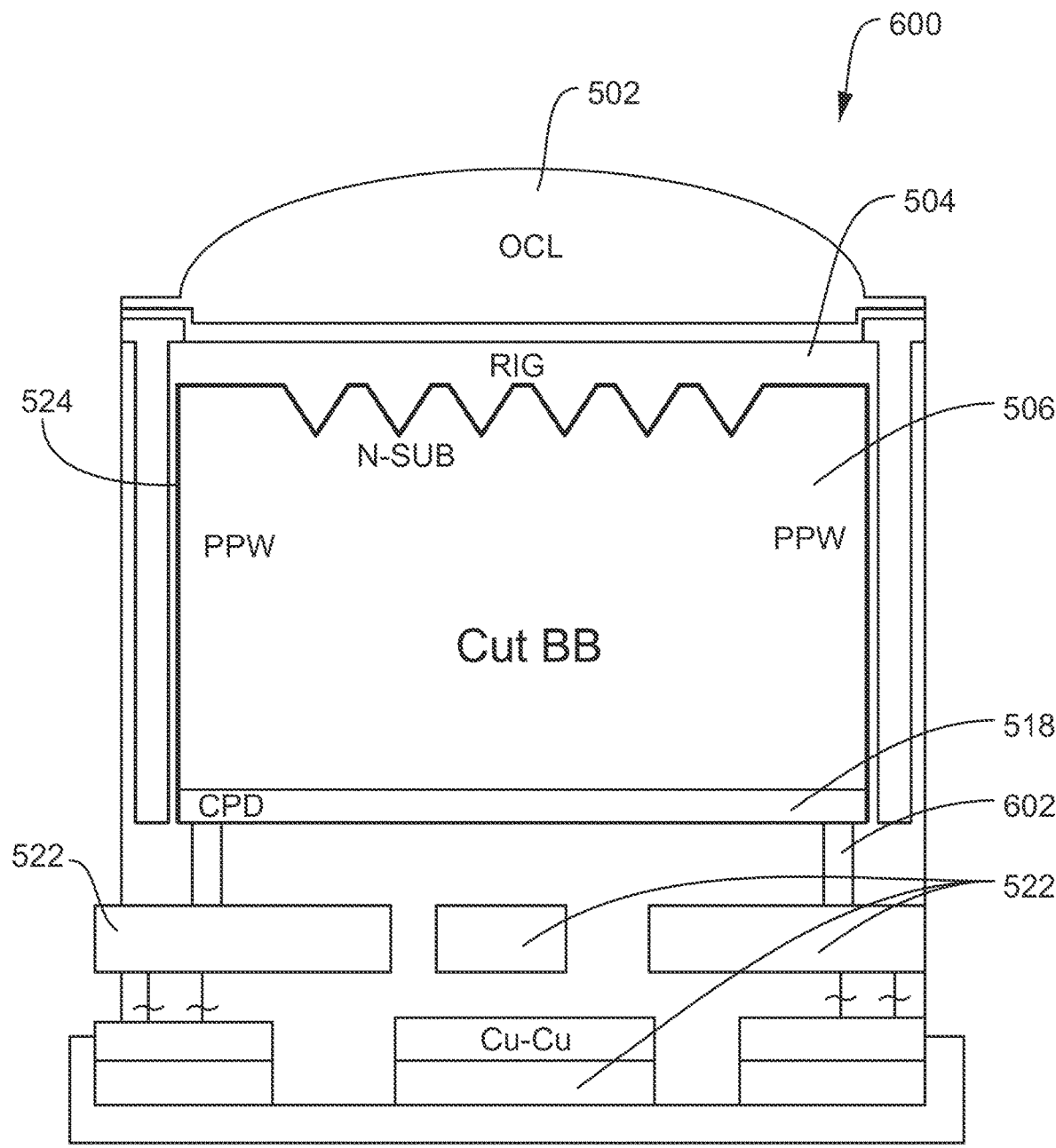
FIG. 6 is diagram illustrating a second cross-section view of the BSI SPAD of FIG. 4, in accordance with various aspects of the present disclosure.

FIG. 6 is diagram illustrating a second cross-section view 600 of the BSI SPAD 401 of FIG. 4, in accordance with various aspects of the present disclosure. The BSI SPAD 401 of FIG. 4, in the second cross-section view 600, includes the OCL 502, the RIG 504, the PPW 506, the CPD 518, and the copper wirings 522. Additionally, as illustrated in the second cross-section view 600, the BSI SPAD 401 of FIG. 4 includes metal vias 602 between the CPD 518 and the copper wirings 522.

Figure 7:
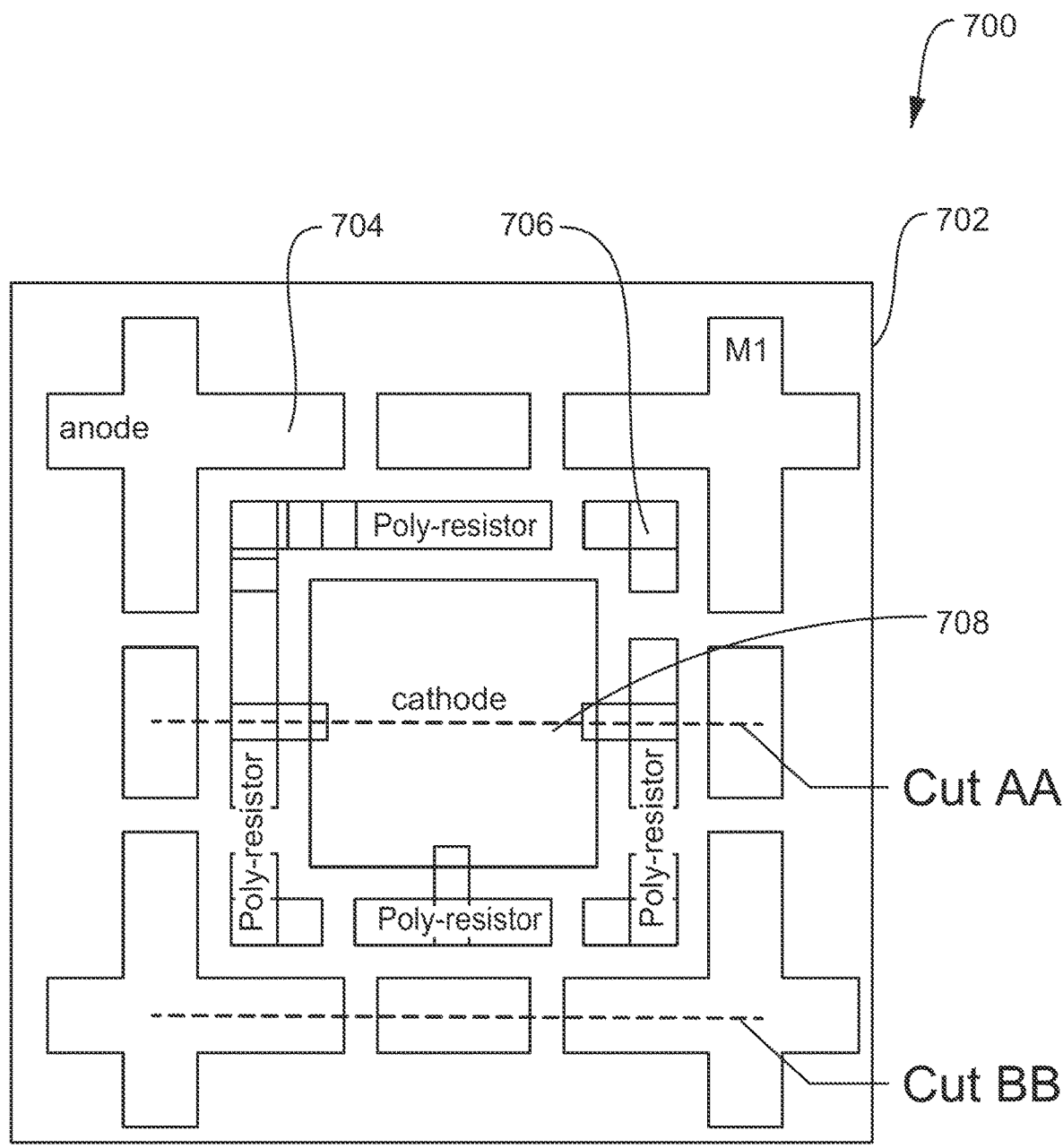
FIG. 7 is a diagram illustrating a plan view of a barrierless BSI SPAD, in accordance with various aspects of the present disclosure.

FIG. 7 is a diagram illustrating a plan view 700 of a barrierless BSI SPAD 702, in accordance with various aspects of the present disclosure. Similar to the BSI SPAD 401, the barrierless BSI SPAD 702 includes an anode 704, a poly-resistor 706, and a cathode 708. However, unlike the BSI SPAD 401, the barrierless BSI SPAD 702 does not an electric potential barrier.

Figure 8:
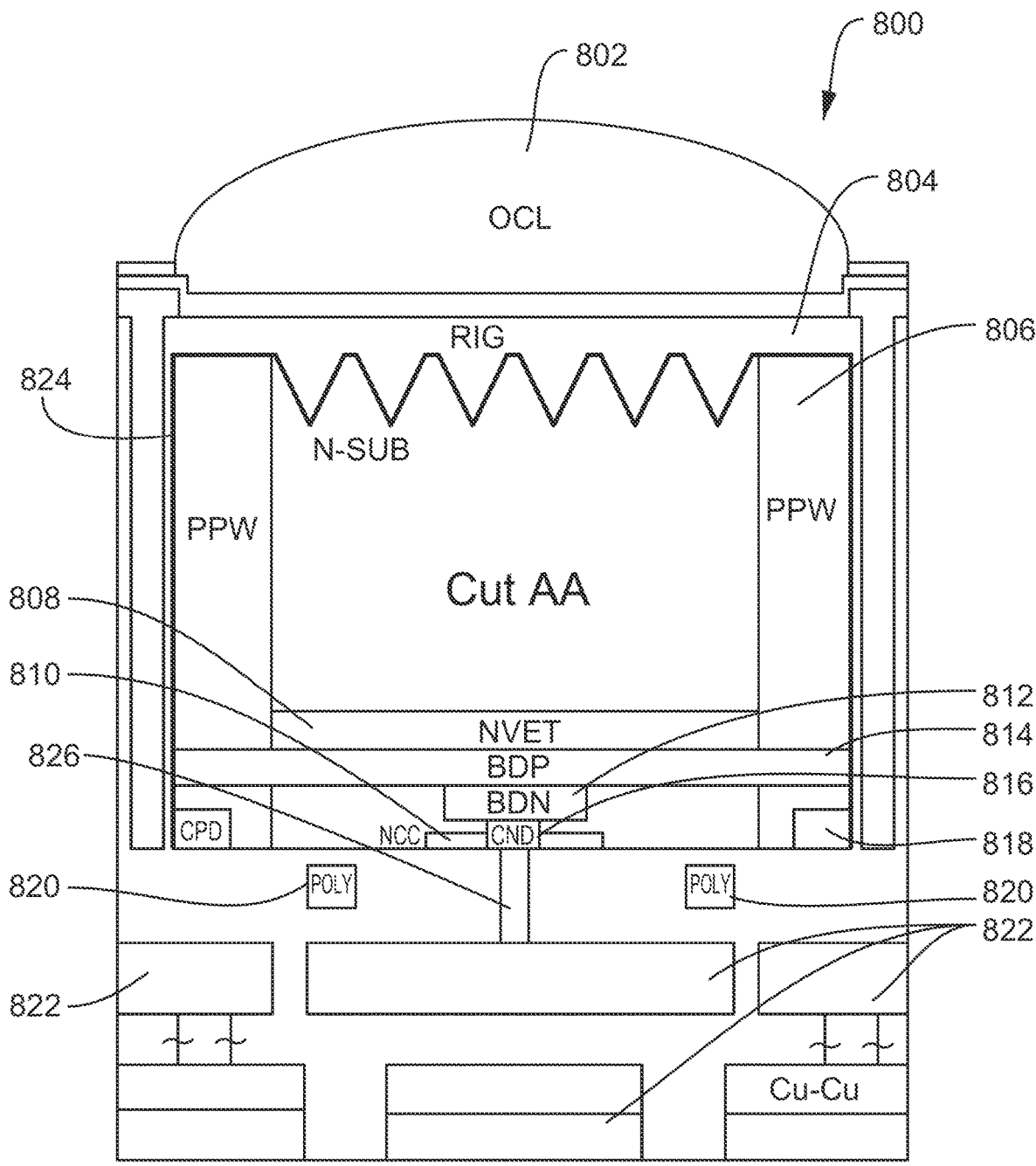
FIG. 8 is a diagram illustrating a first cross-section view of a first example of the barrierless BSI SPAD of FIG. 7, in accordance with various aspects of the present disclosure.

FIG. 8 is a diagram illustrating a first cross-section view 800 of a first example of the barrierless BSI SPAD 702 of FIG. 7, in accordance with various aspects of the present disclosure. The barrierless BSI SPAD 702 of FIG. 7, in the first cross-section view 800, includes an OCL 802, a RIG 804, a PPW 806, an NVET 808, an NCC 810, a BDP 812, a BDN 814, a CND 816, a CPD 818, a poly-resistor 820, copper wirings 822, and undoped silicon 824 that are similar and correspond to the OCL 502, the RIG 504, the PPW 506, the BDP 512, the BDN 514, the CND 516, the CPD 518, the poly-resistor 520, the copper wirings 522, and the undoped silicon 524 of FIG. 5.

However, the first cross-section view 800 of the first example of the barrierless BSI SPAD 702 of FIG. 7 does not include the PVET 508 or the LET 510 of the BSI SPAD 401 of FIG. 4. Instead, the first cross-section view 800 of the first example of the barrierless BSI SPAD 702 of FIG. 7 includes the NVET 808 that is disposed above the BDP 812 and the NCC 810 that is disposed adjacent to the CND 816. However, unlike the PVET 508 of FIG. 5, the NVET 808 is disposed directly on the BDP 812. Additionally, unlike the BSI SPAD 401 of FIG. 4, the first cross-section view 800 of the first example of the barrierless BSI SPAD 702 of FIG. 7 includes a metal via 826 between the CND 816 and the copper wirings 822.

Further, unlike the BSI SPAD 401 of FIG. 4, the BDP 812, the BDN 814, and the CND 816 of the first cross-section view 800 of the first example of the barrierless BSI SPAD 702 of FIG. 7 has a different structure than the BDP 512, the BDN 514, and the CND 516. For example, the BDP 812 has a larger width than the BDN 814 because the BDP 812 extends from a first edge of the PPW 806 to an opposite edge of the PPW 806, whereas the BDP 512 does not extend into the PPW 506 and has a smaller width than the BDN 514. For example, the BDN 814 is disposed on a single CND 816 that is disposed on the metal via 826, whereas the BDN 514 is disposed on two CND 516 that are disposed on the RIG 504.

Additionally, as illustrated in FIG. 8, the undoped silicon 824 from the original silicon wafer is between the RIG 804 and the CPD 818. The undoped silicon 824 is from the original silicon wafer that existed prior to processing and was left behind when the original silicon wafer was processed and thinned down. The undoped silicon 824 has a vertical thickness of at least five micrometers (μm).

Figure 9:
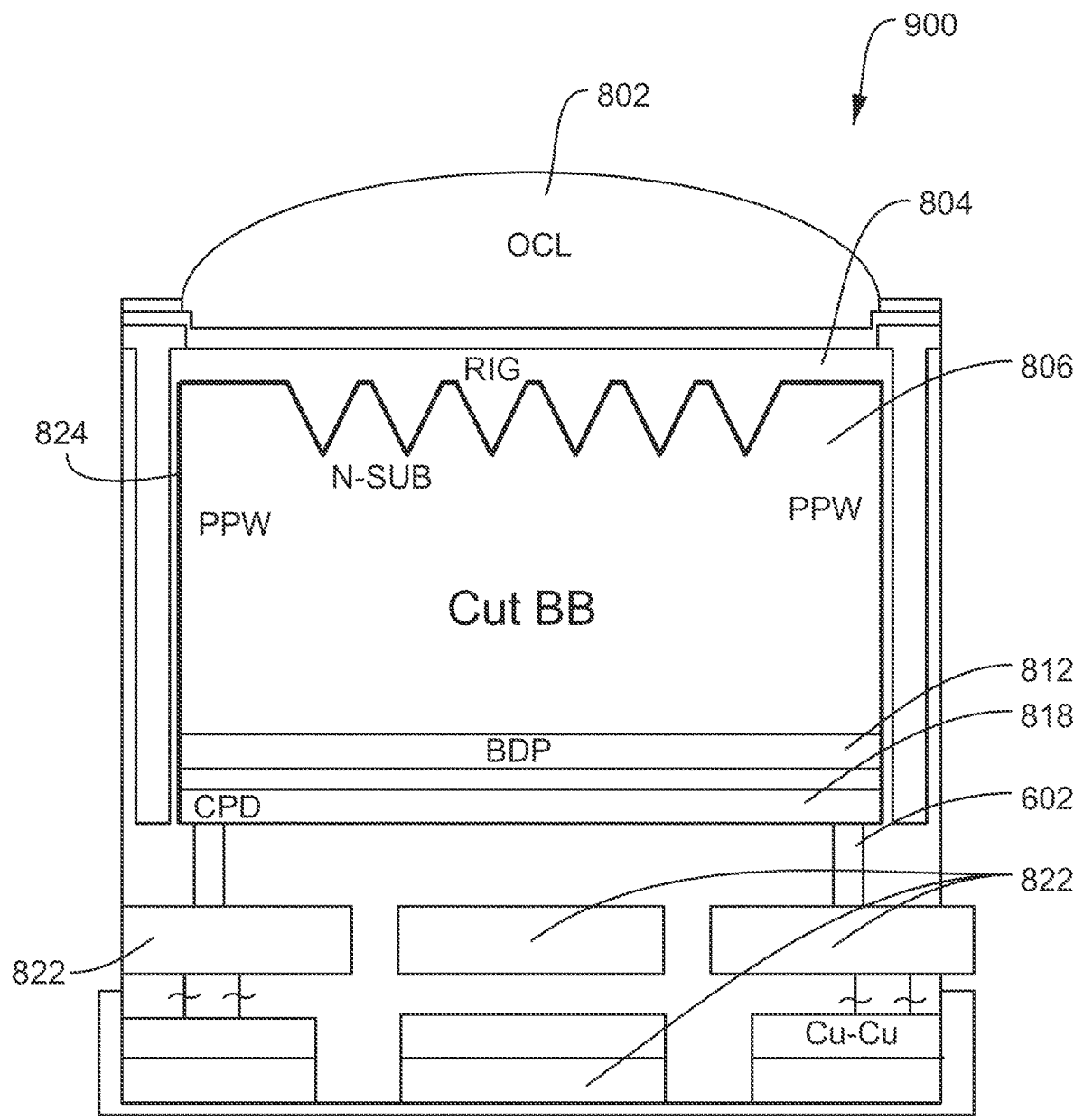
FIG. 9 is a diagram illustrating a second cross-section view of the first example of the barrierless BSI SPAD of FIG. 7, in accordance with various aspects of the present disclosure.

FIG. 9 is a diagram illustrating a second cross-section view 900 of the first example of the barrierless BSI SPAD 702 of FIG. 7, in accordance with various aspects of the present disclosure. FIG. 9 is described with respect to FIG. 8.

The first example of the barrierless BSI SPAD 702 of FIG. 7, in the second cross-section view 900, includes the OCL 802, the RIG 804, the PPW 806, the CPD 818, the copper wirings 822, and metal vias 902 that correspond to the OCL 502, the RIG 504, the PPW 506, the CPD 518, the copper wirings 522, and the metal vias 602 of the BSI SPAD 401 of FIG. 4. Additionally, as illustrated in the second cross-section view 900, the barrierless BSI SPAD 702 of FIG. 7 includes the BDP 812 extending from the first edge of the PPW 806 to the opposite edge of the PPW 806.

Figure 10:
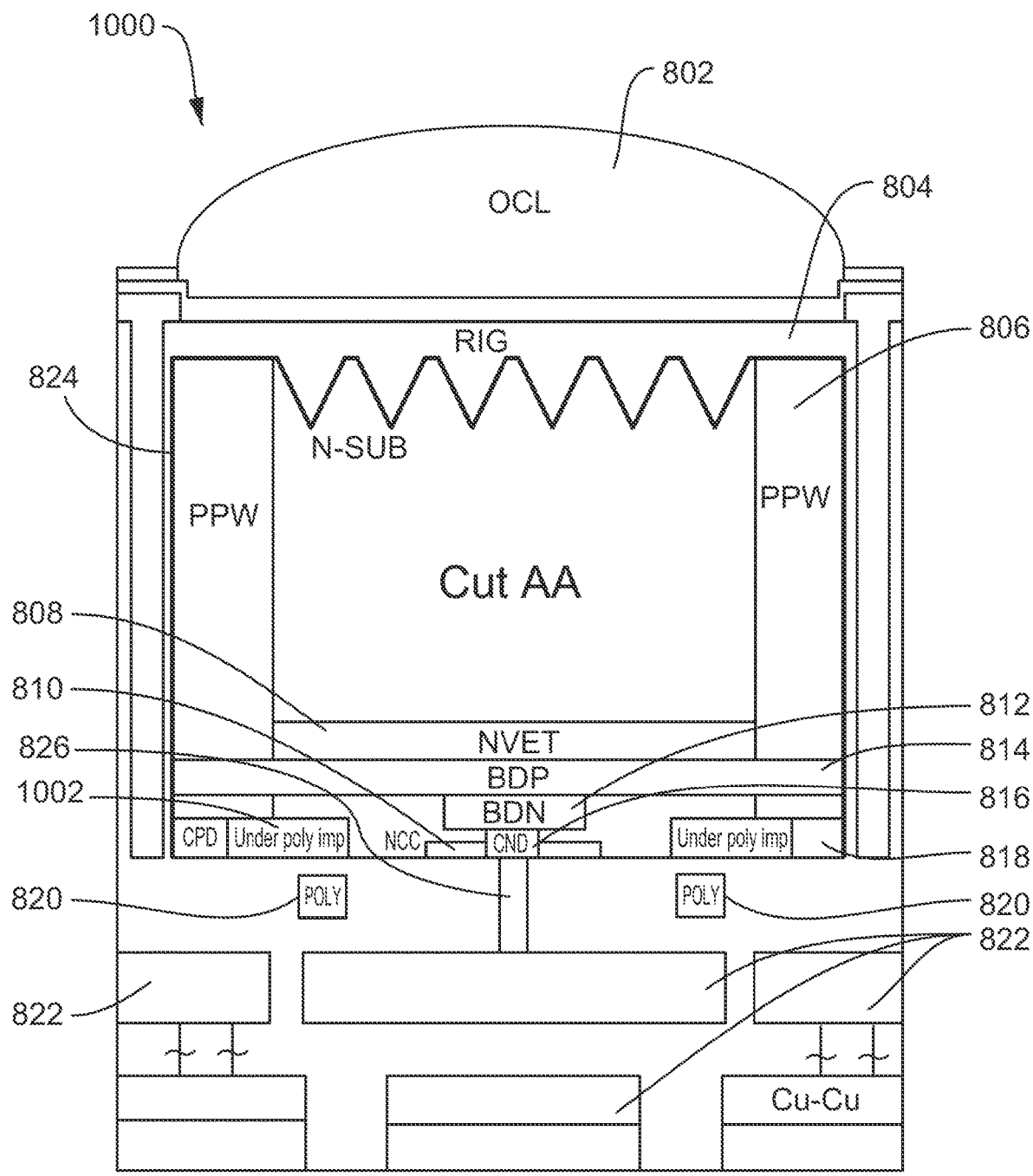
FIG. 10 is a diagram illustrating a first cross-section view of a second example of the barrierless BSI SPAD of FIG. 7, in accordance with various aspects of the present disclosure.

FIG. 10 is a diagram illustrating a first cross-section view 1000 of a second example of the barrierless BSI SPAD 702 of FIG. 7, in accordance with various aspects of the present disclosure. The second example of the barrierless BSI SPAD 702 is nearly identical to the first example of the barrierless BSI SPAD 702 with the difference being an addition of an under poly implant 1002 that is disposed on the RIG 804 and directly adjacent to the CPD 818. The under poly implant 1002 may counteract effects from the poly-resistor 820 on potential in the silicon.

Figure 11:
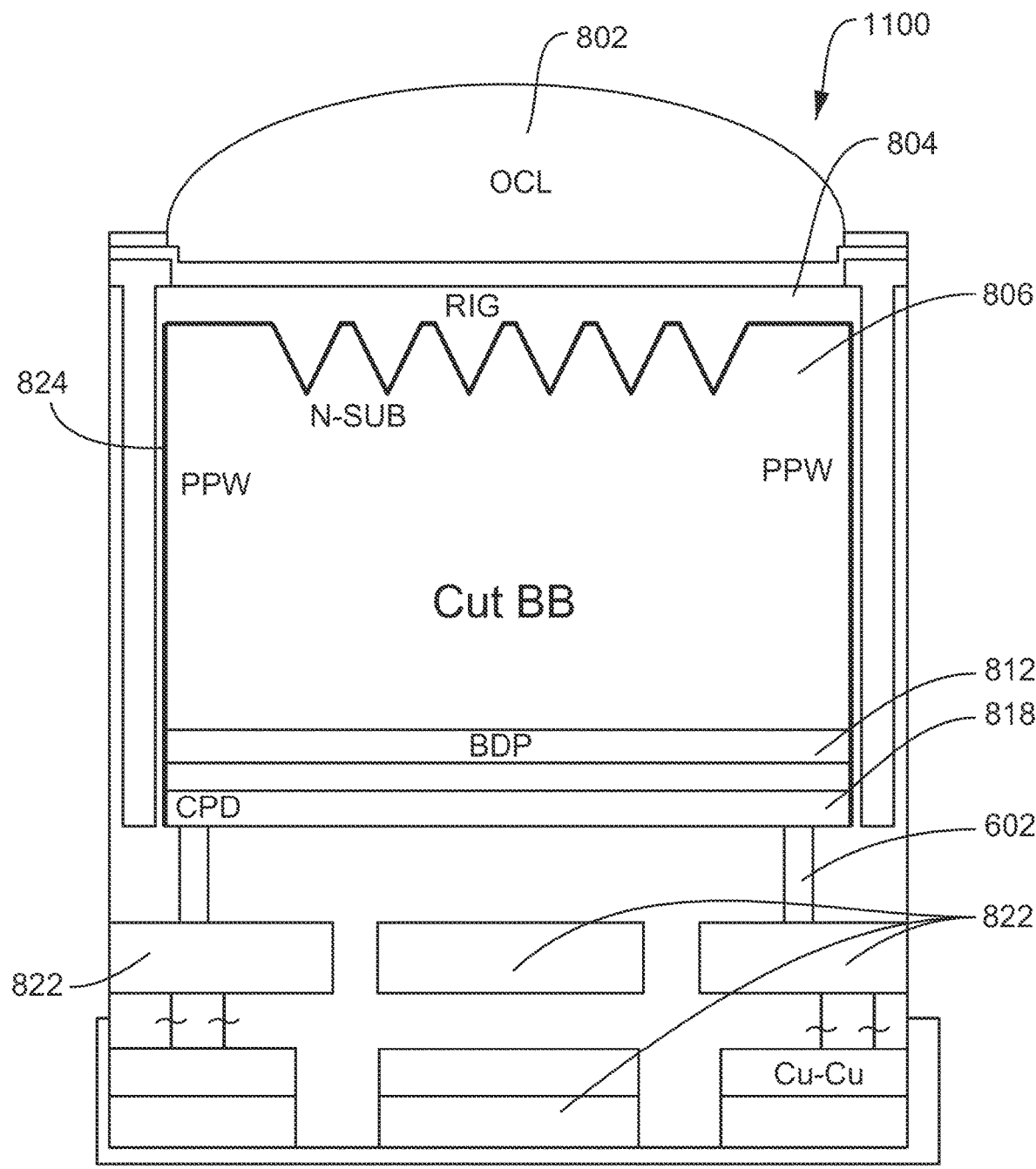
FIG. 11 is a diagram illustrating a second cross-section view of the second example of the barrierless BSI SPAD of FIG. 7, in accordance with various aspects of the present disclosure.

FIG. 11 is a diagram illustrating a second cross-section view 1100 of the second example of the barrierless BSI SPAD 702 of FIG. 7, in accordance with various aspects of the present disclosure. As explained above, the second example of the barrierless BSI SPAD 702 is nearly identical to the first example of the barrierless BSI SPAD 702 with the difference being an addition of an under poly implant 1002 (not shown and behind the CPD 818) that is disposed on the RIG 804 and directly adjacent to the CPD 818.

Figure 12:
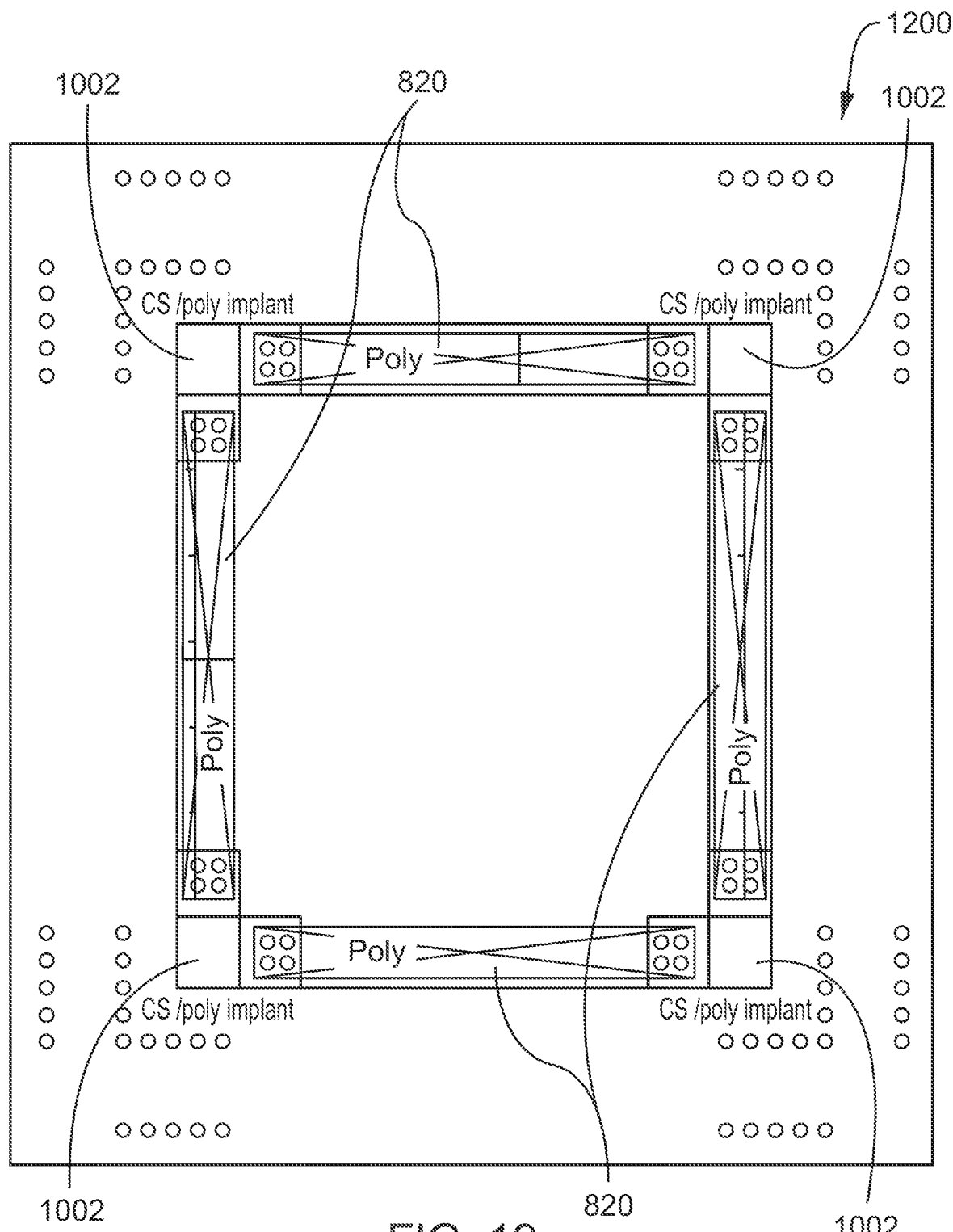
FIG. 12 is a diagram illustrating a second plan view of the barrierless BSI SPAD of FIG. 7, in accordance with various aspects of the present disclosure.

FIG. 12 is a diagram illustrating a second plan view 1200 of the barrierless BSI SPAD 702 of FIG. 7, in accordance with various aspects of the present disclosure. The second plan view 1200 illustrates four poly-resistor segments 820 that are connected together with four contact/poly implants 1202 that corresponds to the poly implant 1002 of FIG. 10. As illustrated in FIG. 12, the four poly-resistor segments 820 are connected between the anode 402 and the cathode 408.

Figure 13:
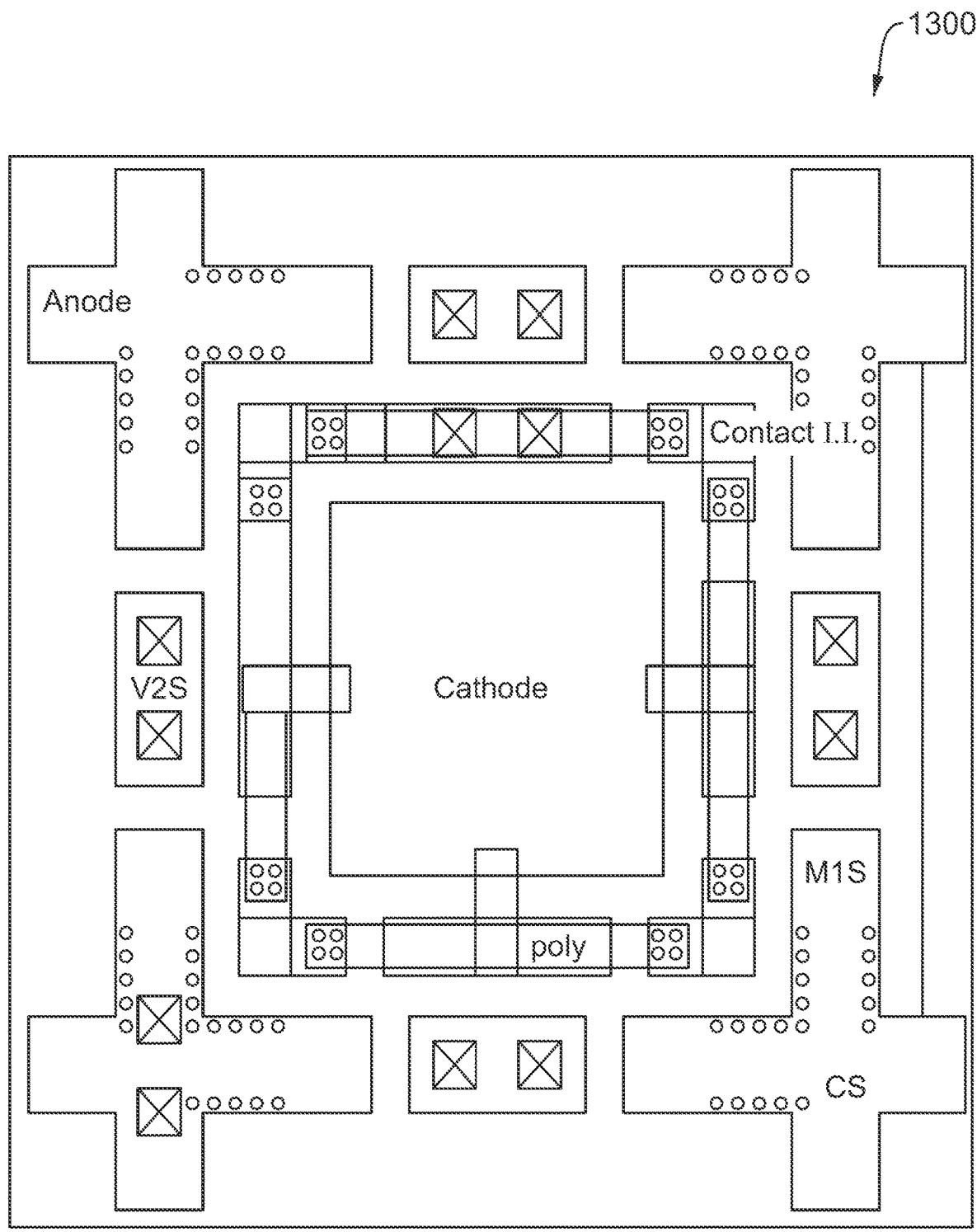
FIG. 13 is a diagram illustrating a third plan view of the barrierless BSI SPAD of FIG. 7, in accordance with various aspects of the present disclosure.

FIG. 13 is a diagram illustrating a third plan view 1300 of the barrierless BSI SPAD 702 of FIG. 7, in accordance with various aspects of the present disclosure. The third plan view 1300 illustrates metal M1S and via V2S. The via V2S may be used to connect metal 2 and may be used for a connection between different parts of the copper wirings 822.

The layout of the metal M1S may be symmetrical or non-symmetrical. Since the metal M1S is reflective, there are advantages to making the metal M1S layer as symmetric as possible. A symmetric reflective layer maintains uniformity within the SPAD angular performance. In some examples, the metal layers and poly-resistor layers are made to be as symmetric as possible.

Figure 14:
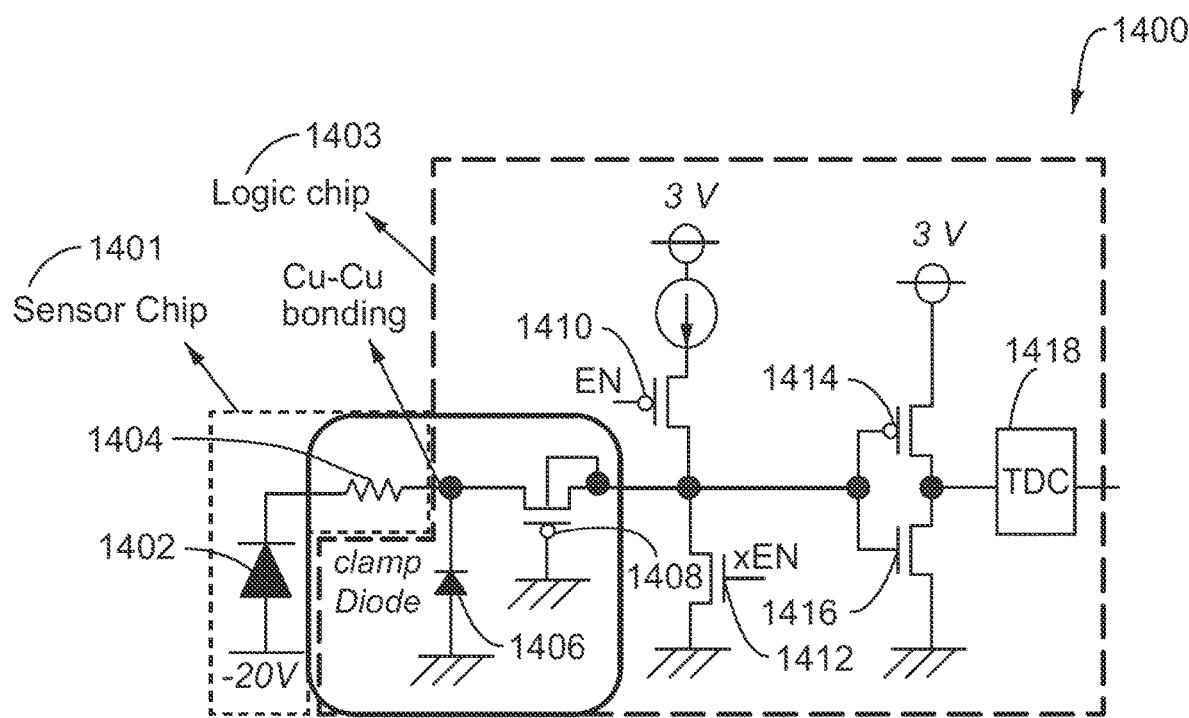
FIG. 14 is a circuit diagram illustrating circuitry 1400 including a BSI SPAD, in accordance with various aspects of the present disclosure.

FIG. 14 is a circuit diagram illustrating circuitry 1400 including a BSI SPAD, in accordance with various aspects of the present disclosure. As illustrated in FIG. 14, the circuitry 1400 includes a sensor chip 1401 and processing circuitry located on a logic chip 1403. The sensor chip 1401 includes a BSI SPAD 1402 and a resistor 1404 that facilitates shrinking capabilities of the sensor chip 1401. In some examples, the BSI SPAD 1402 may be either the BSI SPAD 401 of FIG. 4 or the barrierless BSI SPAD 702 of FIG. 7. Additionally, in some examples, the resistor 1404 is made of the poly-resistor components 820 of FIG. 8.

In some examples, liner layers and metal may be used to make the connection between the BSI SPAD 1402 and the resistor 1404. In other examples, the resistor 1404 may be directly connected to the BSI SPAD 1402.

As illustrated in FIG. 14, the BSI SPAD 1402 is copper-to-copper bonded (e.g., the copper wirings 822) to a clamp diode 1406 and a PMOS transistor 1408. However, the bond of the BSI SPAD 1402 to the clamp diode 1406 and the PMOS transistor 1408 is not limited to copper-to-copper bonding. Any wafer-to-wafer bonding technique may be used that provides an electrical connection between the BSI SPAD 1402, the clamp diode 1406, and the PMOS transistor 1408.

The resistor 1404, the clamp diode 1406, and the PMOS transistor 1408 separate the highly negative SPAD voltage (e.g., up to negative twenty volts or other highly negative voltage) from transistors 1410-1416 between the PMOS transistor 1408 and the time-to-digital converter (TDC) 1418. Without the resistor 1404, the clamp diode 1406, and the PMOS transistor 1408 separating the highly negative SPAD voltage, drains of the transistor 1410 and the transistor 1412 may be destroyed due to the high voltage as described earlier. The highly negative SPAD voltage may lead to destruction of transistor by peeling and expansion on the chip or other form of reliability failure, causing an increase in an impedance of the transistor 1410 and the transistor 1412. Additionally, without the resistor 1404, the clamp diode 1406, and the PMOS transistor 1408 separating the highly negative SPAD voltage, a gate of the transistor 1414 may be destroyed due to peeling and expansion on the chip.

Additionally, the sensor chip 1401 may be disposed adjacent to the logic chip 1403 as illustrated in FIG. 14, and in some examples, on the same plane. However, in other examples, the sensor chip 1401 may be stacked on the logic chip in a stacking direction to form a two-layer stacked structure with a copper-to-copper connection between the sensor chip 1401 and the logic chip 1403. The stacking of the sensor chip 1401 and the logic chip 1403 allows for a larger SPAD pixel size (better sensitivity, increased photon detection efficiency, lower cross talk between pixels), higher resolution, and higher fill factor with the same area chip.

Figure 15:
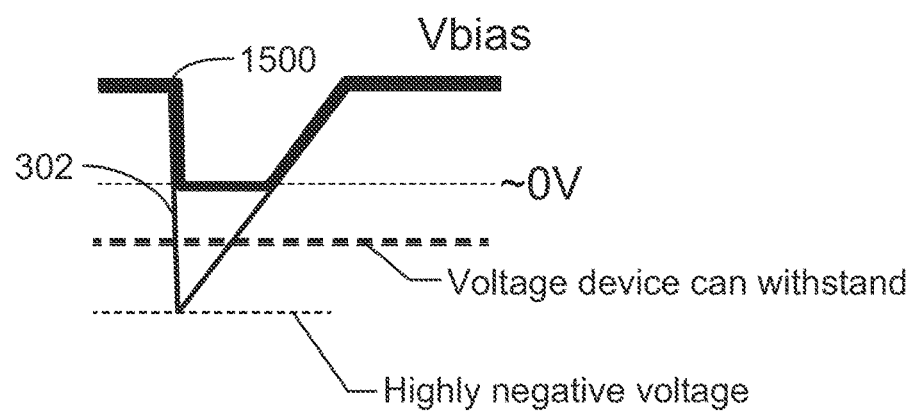
FIG. 15 is a diagram illustrating a bias voltage of the BSI SPAD of FIG. 14, in accordance with various aspects of the present disclosure.

FIG. 15 is a diagram illustrating a bias voltage 1500 of the BSI SPAD 1402 of FIG. 14, in accordance with various aspects of the present disclosure. As illustrated in FIG. 15, when the BSI SPAD 1402 is subjected to a large amount of light, then the bias voltage 1500 is a highly negative voltage that only goes to zero volts because of the clamp diode 1406. The bias voltage 1500 being at zero volts reduces or eliminates failures in the TDC 1418 or other circuitry.

Figure 16:
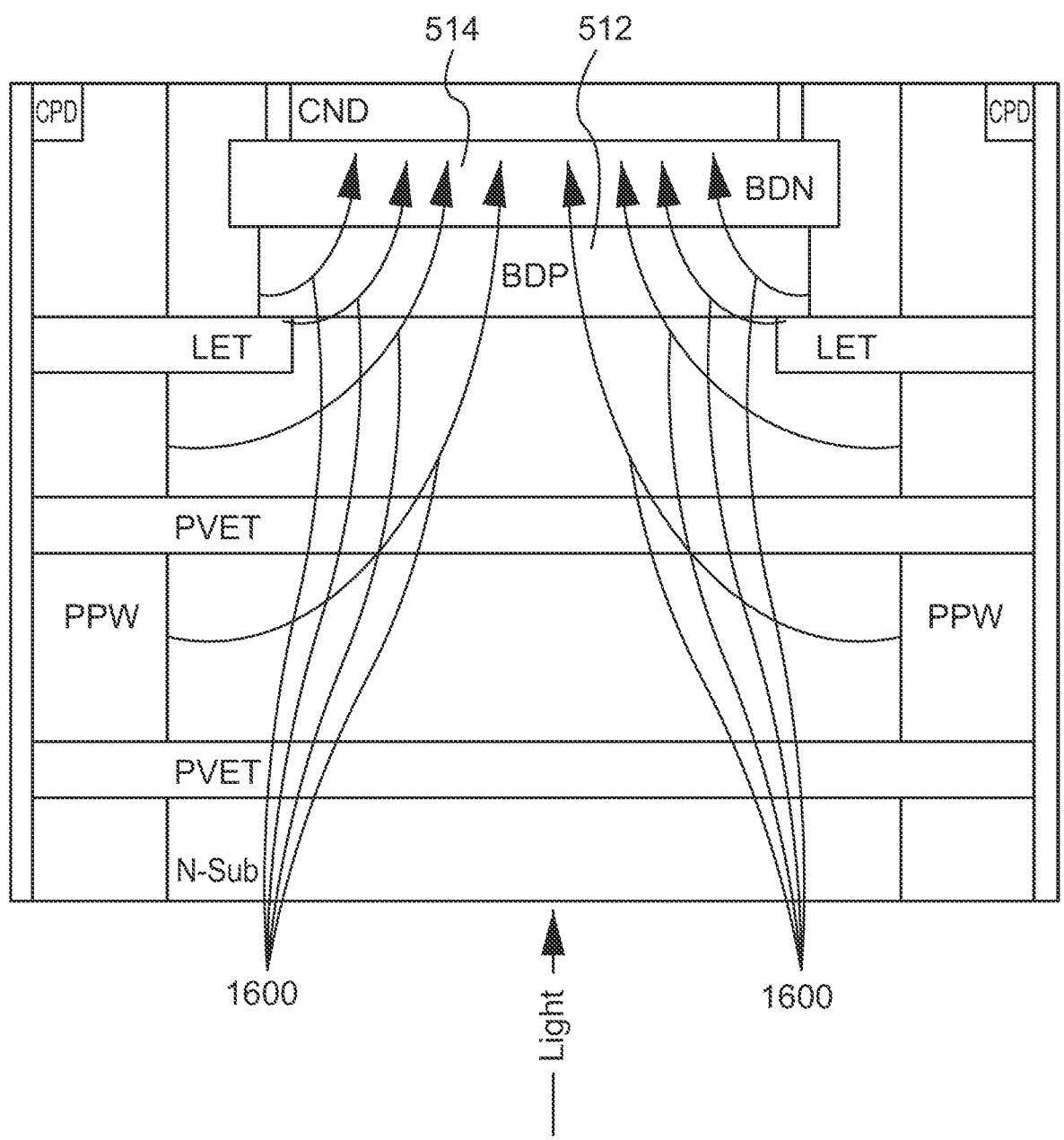
FIG. 16 is diagram illustrating a representation of an electric field in a cross-section view of the BSI SPAD of FIG. 4, in accordance with various aspects of the present disclosure.

FIG. 16 is diagram illustrating a representation of an electric field 1600 in a cross-section view of the BSI SPAD 401 in FIG. 4, in accordance with various aspects of the present disclosure. As illustrated in FIG. 16, the electric field 1600 has electric field lines originating in a direction away from the LET 510 that is directly adjacent to the BDP 512 and towards the PVET 508 and has electric field lines that are evenly spread across the BDP 512 and BDN 514.

Figure 17:
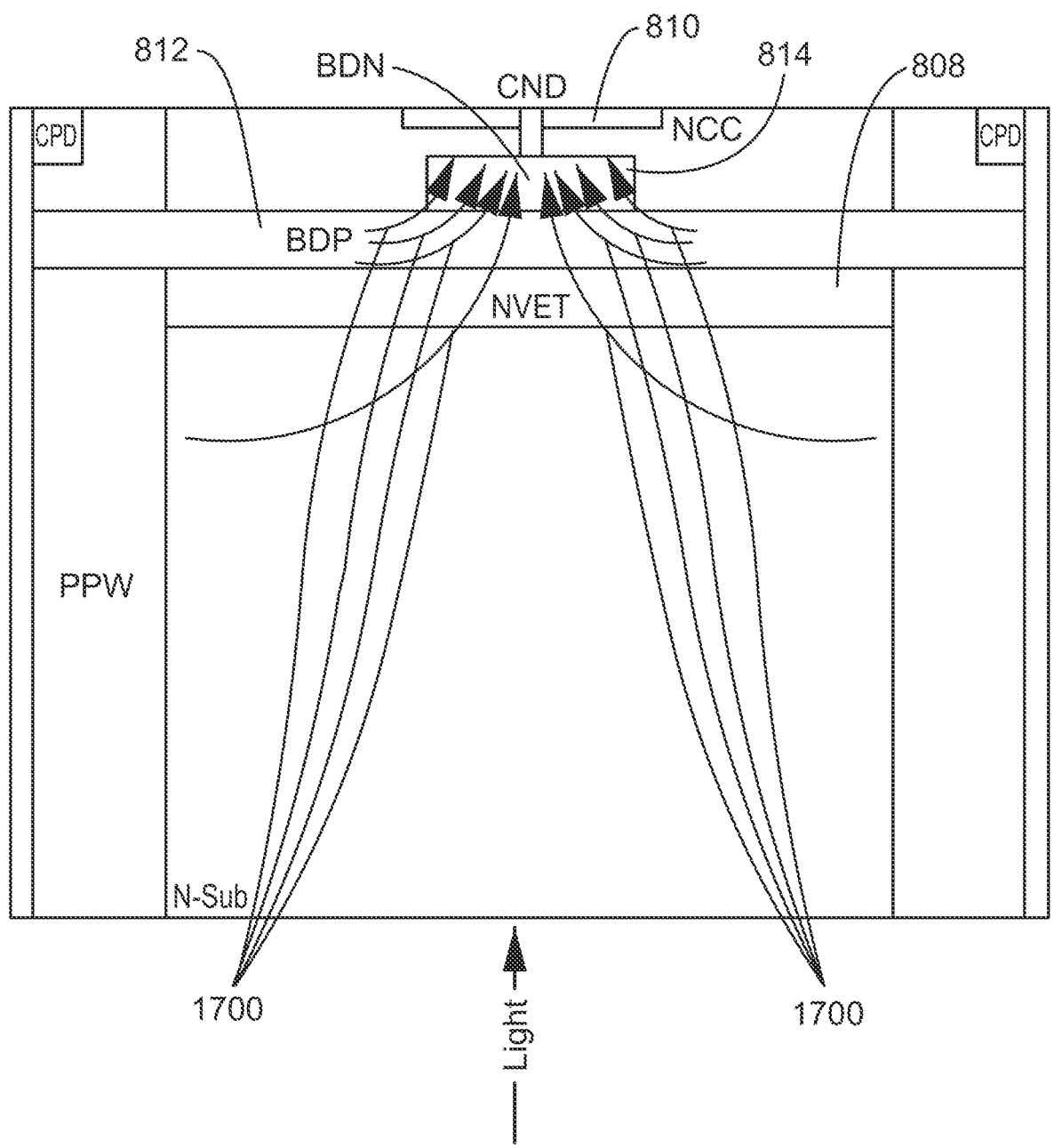
FIG. 17 is a diagram illustrating a representation of an electric field in a cross-section view of the barrierless BSI SPAD of FIG. 7, in accordance with various aspects of the present disclosure.

FIG. 17 is a diagram illustrating a representation of electric field 1700 in a cross-section view of the barrierless BSI SPAD 702 of FIG. 7, in accordance with various aspects of the present disclosure. As illustrated in FIG. 17, the electric field 1700 has electric field lines above the NVET 808 and has electric field lines that are spread across the BDN 814 and condensed in the middle of the BDP 812.

Figure 18:
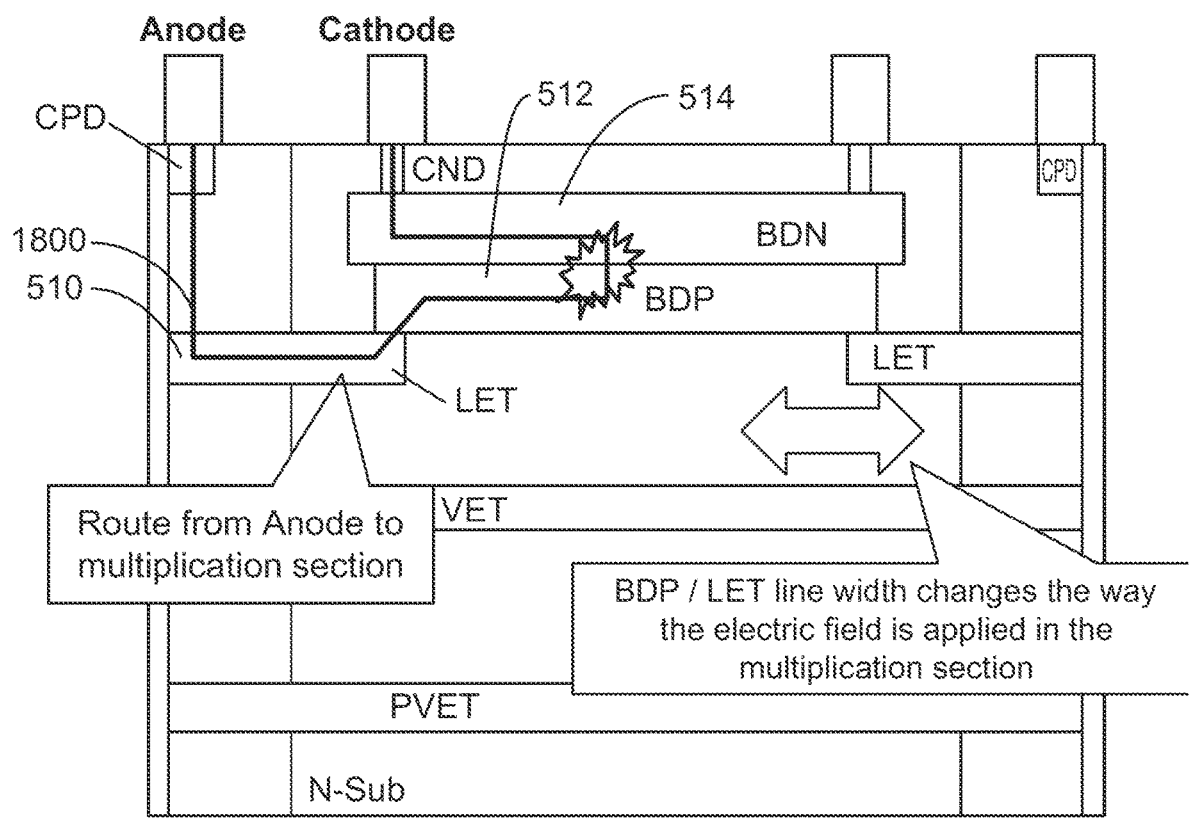
FIG. 18 is diagram illustrating a discharge path in the cross-section view of the BSI SPAD of FIG. 4, in accordance with various aspects of the present disclosure.

FIG. 18 is diagram illustrating a discharge path 1800 in a cross-section view of the BSI SPAD 401 of FIG. 4, in accordance with various aspects of the present disclosure. As illustrated in FIG. 18, the discharge path 1800 is a path between the anode and the cathode and the width of the BDP 512 and the LET 510 changes the way the electric field 1600 is applied to the multiplication section (i.e., the BDP 512 and the BDN 514).

ADDITIONAL EMBODIMENTS

In additional embodiments, a separate mask may be used to include under poly implant (e.g., under poly implant 1002) into the silicon to reduce or eliminate the effect of poly-resistor (e.g., poly-resistor 820) on potential in silicon. In these embodiments, the poly-resistor and the under poly implant may have an overlap of greater than 0.5 micrometers (μm) or greater than zero μm. In other embodiments, the poly-resistor and the under poly implant may have no overlap. In yet other embodiments, no implant under poly may be used.

In additional embodiments, the under poly implant may be formed by extending the CPD mask to account for the under poly implant. In these embodiments, no additional mask is required.

In additional embodiments, dimensions of the poly-resistor may be changed to achieve a necessary target resistance. For example, dimensions of the poly-resistor may be changed to achieve a reference resistance of a few to tens of kilo-ohms (kΩ). In some examples, a dielectric may be patterned and a poly-resistor may be deposited on the patterned dielectric. The deposited poly-resistor will have a larger total length because of the patterned dielectric and the larger total length increases the resistance of the poly-resistor. In other examples, a poly-resistor may include two or more poly layers and the combined total length of the two or more poly layers increases the resistance of the poly-resistor.

CONCLUSION

With regard to the processes, systems, methods, heuristics, etc. described herein, it should be understood that, although the operations of such processes, etc. have been described as occurring according to a certain ordered sequence, such processes could be practiced with the described operations performed in an order other than the order described herein. It further should be understood that certain operations could be performed simultaneously, that other operations could be added, or that certain operations described herein could be omitted. In other words, the descriptions of processes herein are provided for the purpose of illustrating certain embodiments and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of the disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A sensor chip comprising:
   a resistor; and
   a backside illuminated single photon avalanche diode (SPAD) having a first light incident side and a second side opposite to the first light incident side, the backside illuminated SPAD connected to the resistor and including
   an anode disposed on the second side;
   a cathode disposed on the second side; and
   a multiplication structure.

2. The sensor chip of claim 1, wherein the cathode is electrically connected to the multiplication structure at approximately a center of the multiplication structure with at least one metal via.

3. The sensor chip of claim 1, wherein the resistor is a polysilicon resistor.

4. The sensor chip of claim 1, further comprising a metal reflector to reflect light towards the multiplication structure.

5. The sensor chip of claim 1, further comprising one or more micro-lenses to focus light on the multiplication structure.

6. The sensor chip of claim 1, further comprising an inverted pyramid array structure.

7. The sensor chip of claim 1, further comprising first copper wirings configured to bond with second copper wirings of a logic chip.

8. The sensor chip of claim 1, wherein a discharge path between the anode and the cathode is approximately at a center of the multiplication structure.

9. The sensor chip of claim 1, wherein a discharge path between the anode and the cathode is located away from a center of the multiplication structure.

10. The sensor chip of claim 1, wherein the multiplication structure includes a first implant that is disposed closer to the cathode than the anode and a second implant that is disposed closer to the anode than the cathode, and wherein the second implant has a larger width than the first implant.

11. A sensor comprising:
    a sensor chip including a resistor and a backside illuminated single photon avalanche diode (SPAD) pixel structure, the backside illuminated SPAD pixel structure having a first light incident side and a second side opposite to the first light incident side, the backside illuminated SPAD pixel structure is connected to the resistor and includes
    an anode disposed on the second side;
    a cathode disposed on the second side; and
    a multiplication structure.

12. The sensor of claim 11, wherein the cathode is electrically connected to the multiplication structure at approximately a center of the multiplication structure.

13. The sensor of claim 11, wherein the resistor is a polysilicon resistor.

14. The sensor of claim 11, wherein the sensor chip includes at least 100 nanometer (nm) dielectric layer separating the resistor and the backside illuminated SPAD pixel structure.

15. The sensor of claim 11, wherein the resistor is connected to the cathode.

16. The sensor of claim 11, wherein the resistor is at least two kilo-ohms (k106 ).

17. The sensor of claim 11, further comprising a logic chip including a clamp diode, a PMOS transistor, a plurality of transistors, and a time-to-digital converter (TDC).

18. The sensor of claim 17, further comprising a metal reflector below the backside illuminated SPAD pixel structure in a stacking direction, wherein the sensor chip is stacked on the logic chip in the stacking direction, the sensor chip and the logic chip forming a two-layer stacked structure with a copper-to-copper connection between the sensor chip and the logic chip.

19. The sensor of claim 17, wherein the clamp diode is electrically connected to the resistor via copper wirings.

20. A sensor comprising:
    a sensor chip including a resistor and a backside illuminated single photon avalanche diode (SPAD) pixel structure, the backside illuminated SPAD pixel structure is connected to the resistor and includes
    an anode;
    a cathode; and
    a multiplication structure,
    full trench isolation surrounding the backside illuminated SPAD pixel structure.

* * * * *